United States Patent [19]

Aihara et al.

[11] Patent Number: 5,726,495
[45] Date of Patent: Mar. 10, 1998

[54] HEAT SINK HAVING GOOD HEAT DISSIPATING CHARACTERISTICS

[75] Inventors: Toshio Aihara, Sendai; Masahito Tasaka, Amagasaki; Chihiro Hayashi, Takarazuka, all of Japan

[73] Assignee: Sumitomo Metal Industries, Ltd., Osaka, Japan

[21] Appl. No.: 28,156

[22] Filed: Mar. 9, 1993

[30] Foreign Application Priority Data

Mar. 9, 1992 [JP] Japan .................................. 4-050880
Mar. 30, 1992 [JP] Japan .................................. 4-074652

[51] Int. Cl.⁶ .................................................. H01L 23/34
[52] U.S. Cl. .................. 257/722; 257/712; 361/697; 361/703; 361/718; 165/80.3
[58] Field of Search ................. 257/722, 712, 257/721; 361/697, 702, 703, 717, 718; 165/80.3

[56] References Cited

U.S. PATENT DOCUMENTS

| | | | |
|---|---|---|---|
| 3,180,404 | 4/1965 | Nelson et al. | 257/722 |
| 3,961,666 | 6/1976 | Suzuki et al. | 257/722 |
| 4,296,455 | 10/1981 | Leaycraft et al. | 361/383 |
| 4,459,638 | 7/1984 | Brehm et al. | 257/722 |
| 4,694,378 | 9/1987 | Nakayama et al. | 361/385 |
| 4,698,663 | 10/1987 | Sugimoto et al. | 357/81 |
| 4,823,869 | 4/1989 | Arnold et al. | 165/185 |
| 4,879,891 | 11/1989 | Hinshaw | 72/254 |
| 4,884,331 | 12/1989 | Hinshaw | 29/558 |
| 4,884,631 | 12/1989 | Rippel | 257/722 |
| 4,899,210 | 2/1990 | Lorenzetti et al. | 257/722 |
| 5,003,429 | 3/1991 | Baker et al. | 257/722 |
| 5,083,194 | 1/1992 | Bartilson | 357/81 |
| 5,155,579 | 10/1992 | AuYeung | 357/81 |

FOREIGN PATENT DOCUMENTS

| | | |
|---|---|---|
| 0 029 501 | 6/1981 | European Pat. Off. |
| 0 253 162 | 1/1988 | European Pat. Off. |
| 0540420 A2 | 5/1993 | European Pat. Off. |
| 0542478 A1 | 5/1993 | European Pat. Off. |
| 56-198 | 8/1975 | Japan |
| 61-051931 | 3/1986 | Japan |
| 61-100361 | 5/1986 | Japan |
| 2 204 181 A | 11/1988 | United Kingdom |
| 91/11024 | 7/1991 | WIPO |

OTHER PUBLICATIONS

"The Application of Two-Phase Push-Pull Cooling Module in Pin-fin array Electronic Device," Yu-Lin Chao and Fang-Lin Chao, (Eighth Annual IEEE Semi Conductor Thermal Measurement and Management Symposium, Feb. 3-5, 1992) pp. 97-100.
Electronics Int'l., 55(17):46-48 (Aug. 1982).

Primary Examiner—Tom Thomas
Assistant Examiner—David Ostrowski
Attorney, Agent, or Firm—Burns, Doane, Swecker & Mathis, LLP

[57] ABSTRACT

A heat sink comprising a bottom plate and a plurality of fin groups on the bottom plate is disclosed, the plurality of the groups being spaced from one another, and aligned in a matrix form or arranged in a staggered pattern, and each of the group comprising a plurality of plane parallel plates or pins that are integral with the bottom plate.

23 Claims, 13 Drawing Sheets

⊕: AIR IN
⊖: AIR OUT
⇨: AIR FLOW

☉ : AIR OUT
⇨ : AIR FLOW

⊕ : AIR IN
⊖ : AIR OUT
⇒ : AIR FLOW

HEAT SINK HAVING GOOD HEAT DISSIPATING CHARACTERISTICS

BACKGROUND OF THE INVENTION

This invention relates to a heat sink with cooling fins for use on a multi-chip module, and more particularly to a heat sink with cooling fins that is used for cooling a multi-chip module (MCM) which is fabricated by sealing a plurality of semiconductor chips such as large-scale integrated circuits (LSI) and ultra large-scale integrated circuits (ULSI) that are packed close to one another. The invention also relates to a process for producing the heat sink with cooling fins.

In order to cope with the rapid increase in the quantity of information that needs be processed and to meet the demand for processing information at higher speeds, efforts are being made to enhance the integration of LSIs, ULSIs and other electronic devices by reducing the physical size of electronic circuits within a chip. At the same time, the electronics industry has seen a rapid increase in the use of multi-chip modules (MCM) that are fabricated by sealing a plurality of highly integrated chips that are packed close to one another.

Since a plurality of chips each having a high integration level are mounted close together, the density and quantity of heat generation from a MCM are by far greater than for a conventional single IC package. In order to insure the rated circuit operating speed and device reliability, an MCM must be cooled in such a way that the individual chips are held below a maximum permissible temperature. Under the circumstances, various structures having a heat sink attached to a multi-chip module package have been proposed with a view to insuring that heat generated from the chips is efficiently dissipated to the exterior of the package. Two typical models of the heat sink are a plate fin type and a pin fin type.

FIGS. 1a and 1b are simplified perspective views of a plate fin type heat sink and a pin fin type heat sink, respectively. The plate fin type heat sink shown in FIG. 1a is conventionally formed and manufactured by either hot extrusion or milling.

FIG. 2 is an illustration of hot extrusion as a prior art method of forming a plate fin type heat sink. A heated billet 16 is inserted into a container 15 and is pressed from behind with a plunger 17 so that a long semifinished product 19 is extruded through a hole 20 of a die 18 that is of the same shape as the hatched area A of FIG. 1(a). A prescribed length of the extrudate is cut off to produce a channel fin type heat sink 8. When producing the plate fin type heat sink 8 by extrusion, there are limits to thickness t of and gaps g between heat dissipating plates 8a shown in FIG. 1a. The lower limit of the thickness t is said to be about 2 mm, below which working by extrusion becomes very difficult. The lower limit for the gaps g is said to be about 3 mm, below which the strength of die hole 20 cannot be insured. Due to problems of the strength of the die hole as well as metal flow through the die hole, the height h of the heat dissipating plates 8a is generally so set that it will not exceed about 5 times the gap g.

FIG. 3 illustrates how milling is performed to form a plate fin type heat sink. A predetermined number of milling cutters 21 are rotated over a workpiece 22 (a block of the same outside dimensions as the plate fin type heat sink 8 to be produced) to cut grooves 23, which are made progressively deeper by continuing the revolution of milling cutters 21. The thickness t of and gaps g between the heat dissipating plates 8a shown in FIG. 1a are also limited when producing the plate fin type heat sink 8 by milling. The lower limit of the thickness t is said to be about 1.5 mm in order to prevent the walls defining each groove 23 from being fractured by the cutting force acting on the walls. The lower limit for practical purposes of the gaps g is said to be about 2 mm, below which the rigidity of milling cutters 21 cannot be insured. For the same reason, the height h of the heat dissipating plates 8a is generally so set that it will not exceed about 10 times the gap g.

As discussed above, the plate fin type heat sink 8 produced by conventional shaping methods has a large plate thickness t and gap g between heat dissipating plates 8a, and their height h is also limited. Hence, if one wants to assure the necessary surface and cross-sectional areas by providing a predetermined number of heat dissipating plates 8a, the planar dimensions $W_1 \times W_2$ of the plate fin type heat sink 8 will inevitably increase.

A process for producing a pin fin type heat sink indicated by 8' in FIG. 1b will now be described. There are a number of ways available today to produce a pin fin type heat sink, including cutting and die casting. However, all of these methods have such poor production efficiency that it is not economically feasible to adopt them in large-scale production. As an example, machining with a milling machine is described below.

As shown in FIG. 3, the process starts by cutting shallow grooves in one direction in one surface of a workpiece 22. Then, the workpiece 22 is rotated 90° in the same plane and grooves are cut in such a direction that they cross the previously formed grooves at right angles. This procedure is repeated so that the depth of the grooves will increase progressively to eventually yield the pin fin type heat sink 8' shown in FIG. 1b. The grooves are made progressively deeper in order to insure that the walls of the grooves formed in the first stage of working will not be deformed by the cutting force of the milling cutters 21. The working method under discussion involves certain dimensional limitations due to the need to prevent deformation, e.g. crouching down of fins, from occurring during the cutting operation. The lower limits on the thickness $d_1(d_2)$ of the heat dissipating pins 8a' and the gaps $g_1(g_2)$ therebetween are said to be about 2 mm and 2.5 mm, respectively, whereas the height h of the pins is generally so set that it will not exceed about 10 times the value of $g_1(g_2)$.

Thus, the pin fin type heat sink 8' produced by the cutting method has large thicknesses $d_1(d_2)$ and gaps $g_1(g_2)$ and the height h is also limited. Hence, if one wants to assure the necessary surface and cross-sectional areas by providing a predetermined number of heat dissipating pins 8a', the planar dimensions $W_1 \times W_2$ of the pin fin type heat sink 8' will inevitably increase.

Thus, whichever method is adopted, increasing the planar dimensions $W_1 \times W_2$ will naturally increase the size of the electronic device which is to be packaged. Hence, this is not a feasible approach.

The conventional method of cooling chips with the heat sinks 8 and 8' shown in FIGS. 1a and 1b, respectively, comprises supplying air (working fluid) to flow in a direction either parallel or perpendicular to bottom plates 8b and 8b'. In this situation, if the fin pitch, or the distance between fins, is merely reduced, the pressure loss that occurs in fluid channels on account of the resistance due to the shape of heat dissipating plates or pins, i.e., profile drag or on account of the fluid resistance between heat dissipating plates or pins will increase and the greater part of the air flow supplied will get around the heat sinks 8 and 8', thus making no contribution to the cooling of chips. If, on the other hand, one attempts to increase the air flow passing through the heat sinks, it is necessary to use a blower of high power since the pressure loss occurring in fluid channels due to profile drag and fluid resistance increases exponentially with the air velocity and, as a result, the space and noise problems will occur.

For these reasons, it is very difficult to cool multi-chip modules to less than the maximum permissible temperature by cooling with conventional heat sinks.

SUMMARY OF THE INVENTION

The principal object of the present invention is to provide a heat sink with cooling fins that is capable of exhibiting remarkable heat dissipating performance in cooling multi-chip modules that are high in both the density and quantity of heat generation, as well as a process for producing such a heat sink with cooling fins.

Another object of the present invention is to provide a heat sink with cooling fins that has a much larger heat dissipating area than conventional plate fin type heat sinks and pin fin type heat sinks having the same envelope volume and which yet is capable of preventing the working fluid from making a detour on account of pressure loss due to the profile drag and fluid resistance in fluid channels, and which permits efficient cooling with the fluid coolant since it is not warmed by any other parts of the heat sink nor will it be stagnant in areas around flow channels in the heat sink, as well as a process for producing such a heat sink with cooling fins.

A more specific object of the present invention is to provide a heat sink with cooling fins which, when used under forced air cooling, exhibits a very high heat dissipating performance from several times to roughly a hundred times higher than the performance of conventional plate fin type heat sinks and pin fin type heat sinks which are used under the same forced air cooling, as well as a process for producing such a heat sink with cooling fins.

The present inventors reviewed various methods of plastic working, cutting, and grinding operations in order to reduce the dimensions of cooling fins and found unexpectedly that a free abrasive grinding method using a wire saw proved to be effective.

The free abrasive grinding method using a wire saw (hereinafter sometimes referred to simply as "wire sawing") has heretobefore been used in cutting brittle materials such as silicon and quartz, but it has generally been thought unsuitable for the purpose of working ductile materials such as soft steels, aluminum (including aluminum alloys), and copper. This is because those materials will not easily undergo brittle fracture on the surface, wire sawing progresses on a workpiece by developing brittle fracture under the action of small abrasive grains that are brought in by the wire and which strike the interior of the workpiece just beneath the surface. However, the results of studies conducted by the present inventors have shown that aluminum and other ductile materials can also be worked easily by wire sawing if the wire feed speed and the work elevation speed are selected appropriately. This finding is quite surprising and contrary to the accepted knowledge in wire sawing technology.

By working ductile materials by wire sawing, the lower limits on the dimensions of heat sinks can be greatly decreased. Stated more specifically with reference to the heat sinks shown in FIGS. 1a and 1b, it has become possible to achieve working to about 0.2 mm for each of the thickness t of heat dissipating plates and the thickness d1 (d2) of heat dissipating pins, whereas the gap g (g1, g2) can be reduced to a lower limit of about 0.1 mm, with the height h being adjustable up to about 100 times the value of g. As a result, the heat dissipating area in a given envelope volume of the heat sink (hereunder called the "occupied volume") has increased markedly over the prior art versions and it has become possible to produce heat sinks that have higher performance and which are more compact than the prior art versions.

The present inventors further found that it is effective to align a plurality of fin groups in a matrix form or arrange them in a staggered or a random pattern in which the groups are spaced from one another, each fin group consisting of two or more unit fin elements, namely, heat dissipating plates or pins. It was also found that it is effective to align a single fin group or a plurality of fin groups each having a hollow center portion in a matrix form or arrange them in a staggered or a random pattern, each of the fin groups being made of a hollow projecting member. The present invention has been accomplished on the basis of these findings.

The essence of the present invention lies in a heat sink that comprises a bottom plate and a plurality of fin groups on the bottom plate, the plurality of the groups being spaced from one another, and aligned in a matrix form or arranged in a staggered pattern, and each of the group comprising a plurality of plane parallel plates or pins that are integral with the bottom plate.

Thus, according to the present invention, a heat sink comprises a bottom plate and a plurality of fin groups disposed on the bottom plate and spaced from one another in a matrix form or arranged in a staggered pattern, each of the fin groups comprising a plurality of plane parallel plates or pins in a form of projecting sections or hollow projecting sections that are integral with the bottom plate.

The present invention also provides a process for producing a heat sink comprising moving a wire array along the shaped projections of a workpiece that comprises a bottom plate and a plurality of shaped projections or hollow projections on said bottom plate that are integral with said bottom plate and which are aligned in a matrix form or arranged in a staggered pattern, said wire array being stretched on the same pitch as a predetermined pitch of fins, urging said wire array against the workpiece with an abrasive containing working fluid being allowed to be present between said wire array and said workpiece, and shaping plane parallel plate fins by forming many parallel grooves having a predetermined depth and width in the shaped projections of said workpiece under the grinding action of the abrasive grains contained in the working fluid.

To form pin groups, a workpiece in which many parallel grooves has been formed in the manner described above may be subjected to a second grinding operation with the grinding direction being shifted by 90 degrees.

In still another aspect of the present invention, therefore, after many parallel grooves have been formed, a wire array that is stretched on the same pitch as that of the fins may be moved to run in a direction that is perpendicular to the plane parallel plate fins on the semifinished product as the semifinished product is urged against the wire array in such a way that the parallel grooves in the semifinished product crosses the wire array at right angles, whereby the parallel walls between the parallel grooves in the semifinished product is cut to a predetermined depth under the grinding action of the abrasive grains to shape pin type fins.

According to a preferred embodiment of the present invention, a workpiece comprising a bottom plate and a plurality of solid or hollow projecting members that project from and are integral with the bottom plate and which are aligned in a matrix form or arranged in a staggered pattern may be worked by performing abrasive grinding on the projecting members with a wire saw while the wire array is permitted to detach from the workpiece in the non-projecting parts.

Generally speaking, the improvement in the heat dissipating performance of heat sinks depends largely upon the increase in the heat dissipating area and in the flow of cooling air. The heat dissipating area can be increased if the dimensions of fins are reduced by making them with a wire saw. However, if one makes an attempt at causing cooling air to flow between the small fins at flow rates that are equal to or greater than those heretofore used, the resistance to air flow will increase markedly due either to the fluid resistance along the fin surfaces (in the case of plate fin type heat sink) or to the pressure resistance that develops on account of the separation of air layers at the front edge of pins (in the case of a pin fin type heat sink). In order to reduce the resistance to the flow of cooling air, it is necessary that the length of fluid channels within the heat sink that present great resistance be shortened so that air will escape rapidly to fluid channels of large dimensions that present small resistance.

To meet this need, rows of small fins are not lumped together as a single mass on the bottom plate but are divided into a plurality of small groups that are spaced apart by grooves having a greater dimension (at least 2-3 mm) than the fluid channels within the heat sink. Because of this structural feature, the air necessary for cooling will flow through individual fin groups without experiencing any substantial resistance and it will thereafter be rapidly released into the ambient atmosphere via the grooves of large dimensions (where the resistance to the flow of air is almost negligible). As a result, the total resistance that develops against air flow is either comparable to or only slightly greater than in conventional heat sinks. Even if the resistance to air flow that develops in the heat sink cooling fin of the present invention is several times greater than what occurs in conventional heat sinks, the heat dissipating ability (the amount of heat dissipating) of the former is at least ten times the value for the latter. Hence, the resistance to air flow per unit amount of heat dissipation (i.e., the power consumption of a blower) is reduced to less than half, whereby excellent heat dissipating performance will be exhibited by the heat sink of the present invention.

As described just above, the heat sink of the present invention satisfies both requirements for a larger heat dissipating area and a smaller resistance to air flow. This is because fin groups of small dimensions that are made by wire sawing are interspersed and because such fin groups are spaced apart by grooves of comparatively large dimensions.

The fin groups are effective irrespective of the manner in which they are arranged, but if they are aligned in a matrix form or arranged in a staggered pattern, the resistance to air flow will be more sufficiently reduced, and the performance of the heat sink to remove heat can be improved.

BRIEF DESCRIPTION OF THE DRAWINGS

FIG. 7a is a simplified perspective view of an example of the heat sink with cooling fins of the present invention;

FIG. 7b is an enlarged view of a portion of FIG. 7a;

FIG. 7c is an enlarged view of a portion of FIG. 7b;

FIG. 8a is a simplified perspective view of another example of the heat sink of the present invention;

FIG. 8b is an enlarged view of a portion of FIG. 8a;

FIG. 8c is an enlarged view of a portion of FIG. 8b;

FIG. 9a is a plan view illustrating the cooling method used in Example 1;

FIG. 9b is a cross section taken along Line A—A of FIG. 9a;

FIG. 10a is a plan view illustrating the cooling method used in Example 2;

FIG. 10b is a cross section taken along Line B—B of FIG. 10a;

FIG. 11a is a plan view of a heat sink of the present invention;

FIG. 11b is a side view of the heat sink of FIG. 11a;

FIG. 11c is a cross section taken along Line A—A of FIG. 11a;

FIG. 11d shows enlarged part B of FIG. 11b;

FIG. 12a is a cross section showing a heat sink of the present invention, taken along Line A—A of FIG. 12b;

FIG. 12b is a cross section taken along Line B—B of FIG. 12a;

FIG. 12c is a cross section taken along Line C—C of FIG. 12a;

FIG. 13a is a cross section of another example of the heat sink of the present invention, taken along Line A—A of FIG. 13b;

FIG. 13b is a cross section taken along Line B—B of FIG. 13a;

FIG. 13c is a cross section taken along Line C—C of FIG. 13a;

FIG. 13d shows enlarged part D of FIG. 13b;

FIG. 14a is a cross section of still another example of the heat sink of the present invention, taken along Line A—A of FIG. 14b;

FIG. 14b is a cross section taken along Line B—B of FIG. 14a;

FIG. 14c is a cross section taken along Line C—C of FIG. 14a;

FIG. 14d shows enlarged part D of FIG. 14b.

DESCRIPTION OF THE PREFERRED EMBODIMENTS OF THE INVENTION

The present invention will now be described below in greater detail with reference to accompanying drawings.

Figure 1:
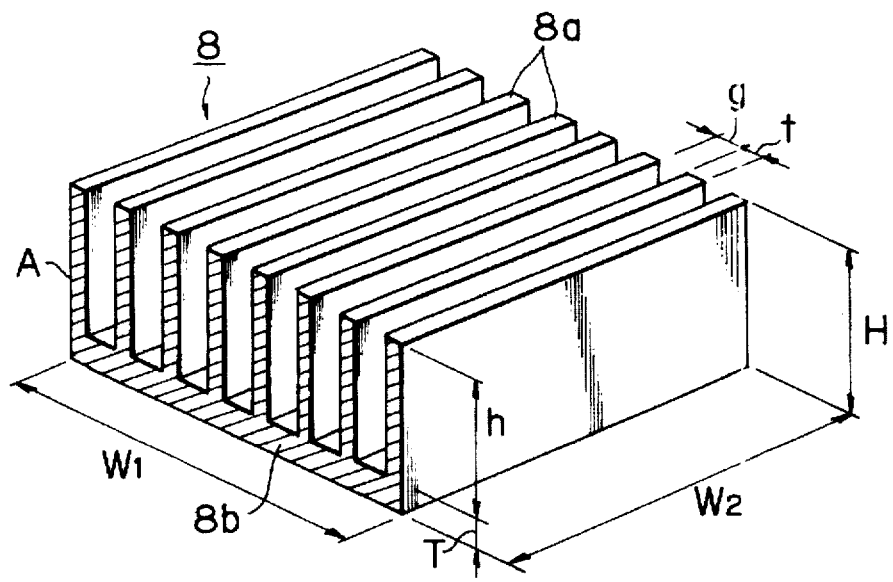
FIG. 1a is a simplified perspective view of a plate fin type heat sink.
FIG. 1b is a simplified perspective view of a pin fin type heat sink.
Figure 1:
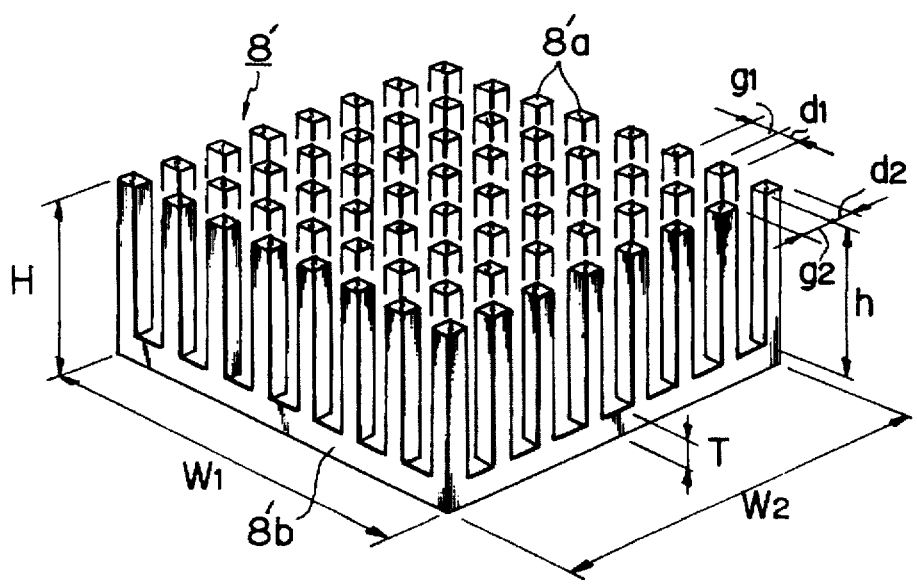
Figure 2:
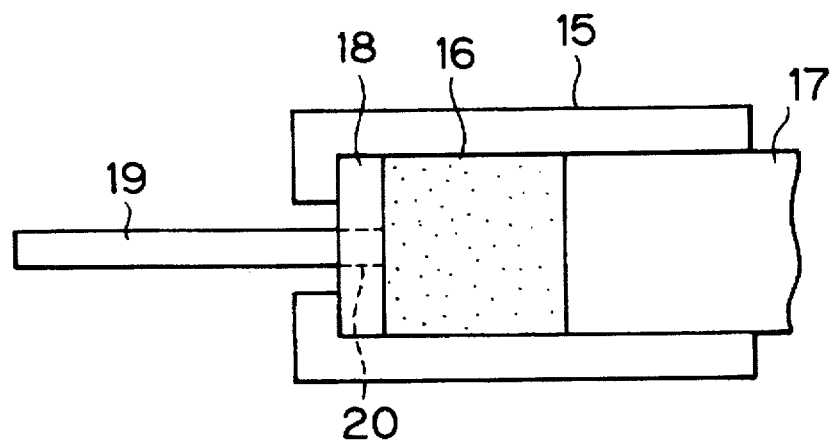
FIG. 2 is a schematic illustration of a method of producing a plate fin type heat sink by extrusion.
Figure 3:
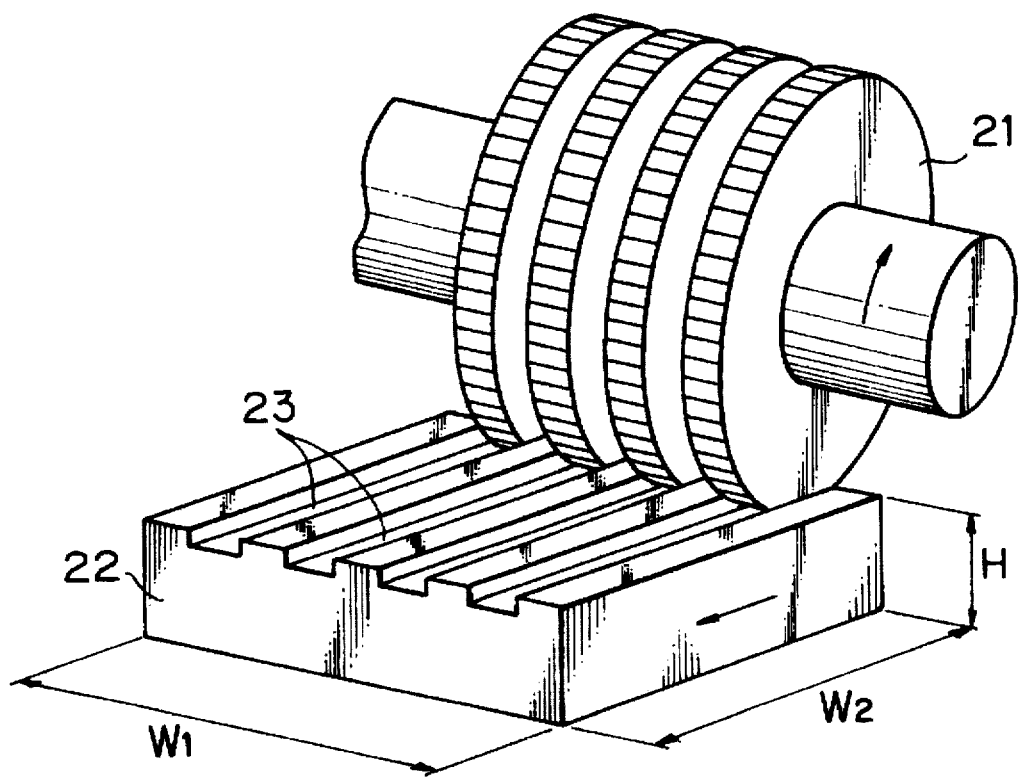
FIG. 3 is a schematic illustration of a method of producing a heat sink by cutting with a milling machine.
Figure 4:
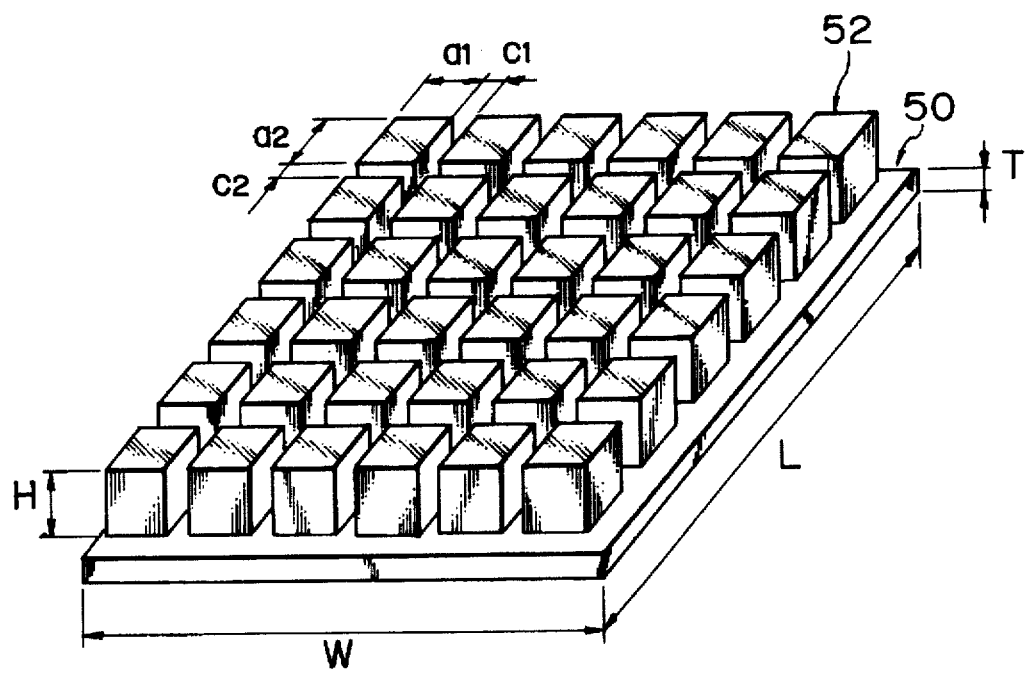
FIG. 4a is a perspective view of a workpiece that may be used to form a heat sink with cooling fins according to the present invention.
FIG. 4b is a perspective view of another workpiece that may be used to form a heat sink according to the present invention.
Figure 4:
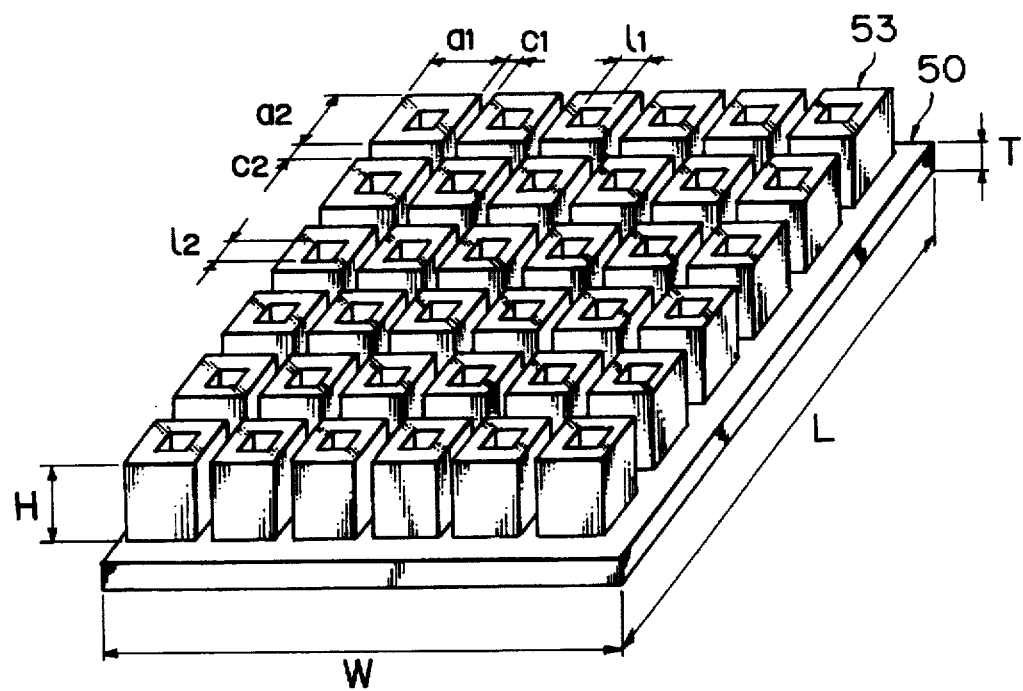

FIGS. 4a and 4b are perspective views showing two types of workpieces used as starting materials for producing a heat sink that employs either plane parallel plates or pins according to the present invention. Either type of workpiece comprises a bottom plate 50 of the same dimensions (W×L× T) as the heat sink to be finally produced and a plurality of projecting members 52, 53 with a height H that are integral with the bottom plate 50 and each of which has a rectangular horizontal cross section with planar dimensions of $a_1 \times a_2$. The workpiece is made of a material having high heat conductivity, such as aluminum or copper or alloys thereof. The individual projecting members 52, 53 are spaced apart by distances $c_1$ and $c_2$ that are equal to the spacings between fin groups to be produced.

The workpiece may be formed by various methods including the cold forging of a plate having planar dimensions of W×L with the thickness greater than T but smaller than H, as well as by cutting a plate having planar dimensions of W×L and a thickness of T+H with a milling cutter.

The process for producing the heat sink of the present invention is described below.

Figure 5:
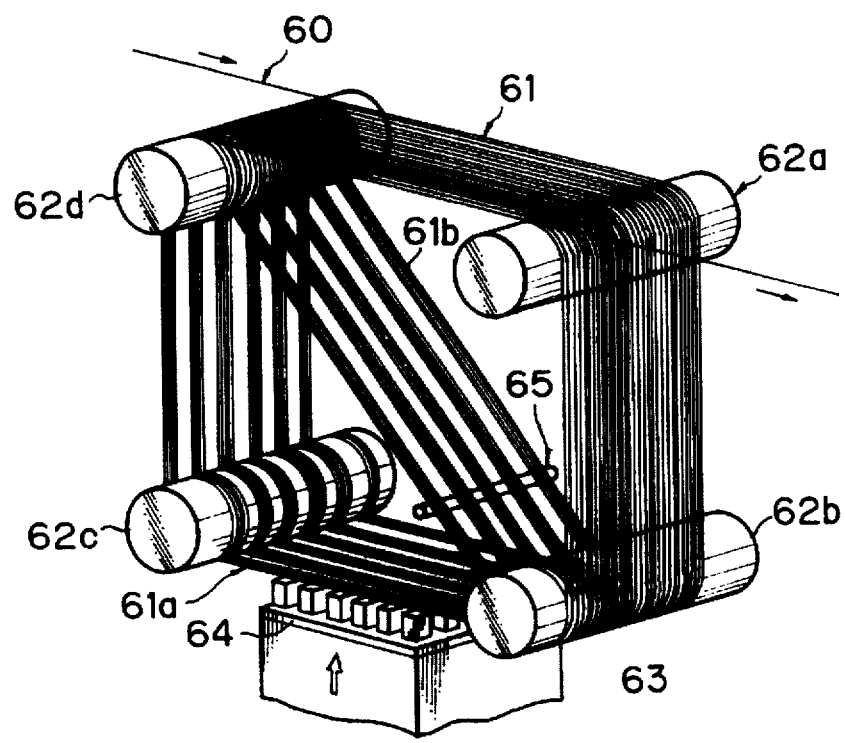
FIG. 5a is an illustration of a wire saw.
FIG. 5b is an illustration of a process for producing the heat sink of the present invention.
Figure 5:
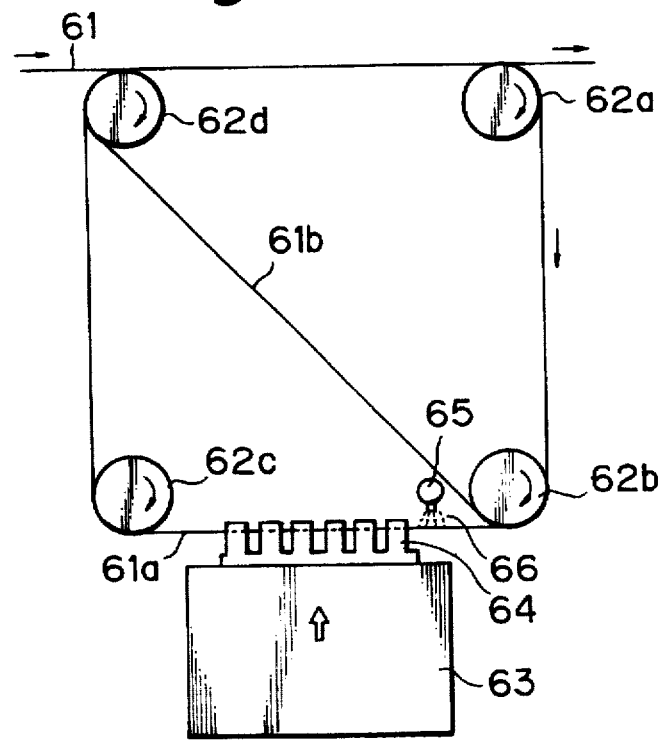

FIGS. 5a–b illustrate a process for producing a heat sink with cooling fins using either plane parallel plates or pins, in which FIG. 5a is a simplified perspective view showing the working section of a multi-wire saw, and FIG. 5b is a front view of the working section.

As shown, a wire 60, such as a piano wire, is delivered from a feed unit (not shown) and wound onto grooved rollers 62a–d to form a wire array 61 in which wires are aligned on a predetermined pitch to extend for a predetermined width. The wire array 61a which contacts the projecting parts of a workpiece 64 and which hence takes part in the working process is wound around four grooved rollers 62a, 62b, 62c and 62d. On the other hand, the wire array 61b which will not participate in the working process is desirably wound in a triangle only around three rollers 62a, 62b and 62d, so as to bypass the non-projecting parts of the workpiece 64. That is not only for preventing the wire array in the non-working areas from striking the formed heat dissipating plates or pins or cutting into the bottom plate on account of vibrations and other external forces but also for preventing the wire from being dislodged or broken on account of the lumps of abrasive grains or foreign matter in the working fluid that have been brought into the gap between each grooved roller and the wire.

It is possible for the wire array that will not participate in the working process to be wound around only two grooved rollers 62a and 62b. However, in order to minimize the number of times by which the wire is bent repeatedly and to insure that the smallest possible force will apply to the grooved rollers, the wire array that will not participate in the working process is preferably wound onto the three grooved rollers 62a, 62b and 62d.

Having thus formed the array by winding the wire around the grooved rollers, the wire 60 travels to the right side of FIG. 5a and is accumulated on a takeup unit (not shown).

At least one of the four grooved rollers 62a, 62b, 62c and 62d is rotationally driven so that the wire travels in one direction while maintaining an array. The workpiece 64 is secured to a work table 63 in such a way that two sides of it are parallel to the wire. When the table 63 is elevated slowly, the workpiece 64 is also lifted and urged against the travelling wire array. At the same time, a working fluid 66 containing abrasive grains is supplied through a nozzle 65 into the gap between the wire array and the workpiece, whereupon the grinding action of the abrasive grains scrapes off the surface of the projections on the workpiece in areas against which the wire array is urged.

Plate fin type heat sink can be shaped by lifting the work table by a distance H (the height of the plane parallel plates) from the position where the workpiece starts to contact the wire array.

Pin fin type heat sink can be shaped by a two-stage process. The first stage is the same as in the case of shaping a plate fin type heat sink. The work table is elevated by a distance H (the height of the heat dissipating plates) from the position where the workpiece starts to contact the wire array, thereby forming a plurality of fin groups each consisting of aligned plane parallel plates. Thereafter, the workpiece is retracted from the wire array and the second stage starts, in which the workpiece is rotated by 90° and urged against the wire array so that it will cross at right angles the longitudinal direction of the plane parallel plates in each fin group. Grinding is then performed as in the first stage, thereby forming a plurality of heat-dissipating pin groups.

Figure 6:
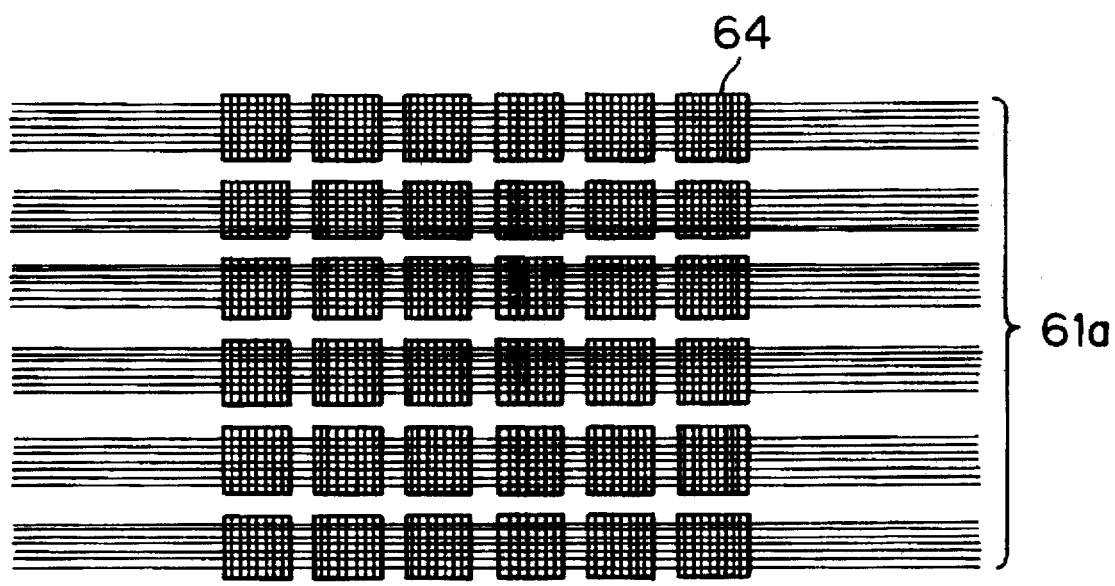
FIG. 6 is an illustration of the position of a wire array in the areas to be worked relative to the workpiece.

FIG. 6 illustrates how the two-stage process is performed. Plate type heat dissipating fins are first formed on the workpiece 64, and then the wire array 61a is positioned in such a way that the individual wires will cross the fins at right angles and the workpiece is subsequently urged against the wire array to be ground.

Figure 7:
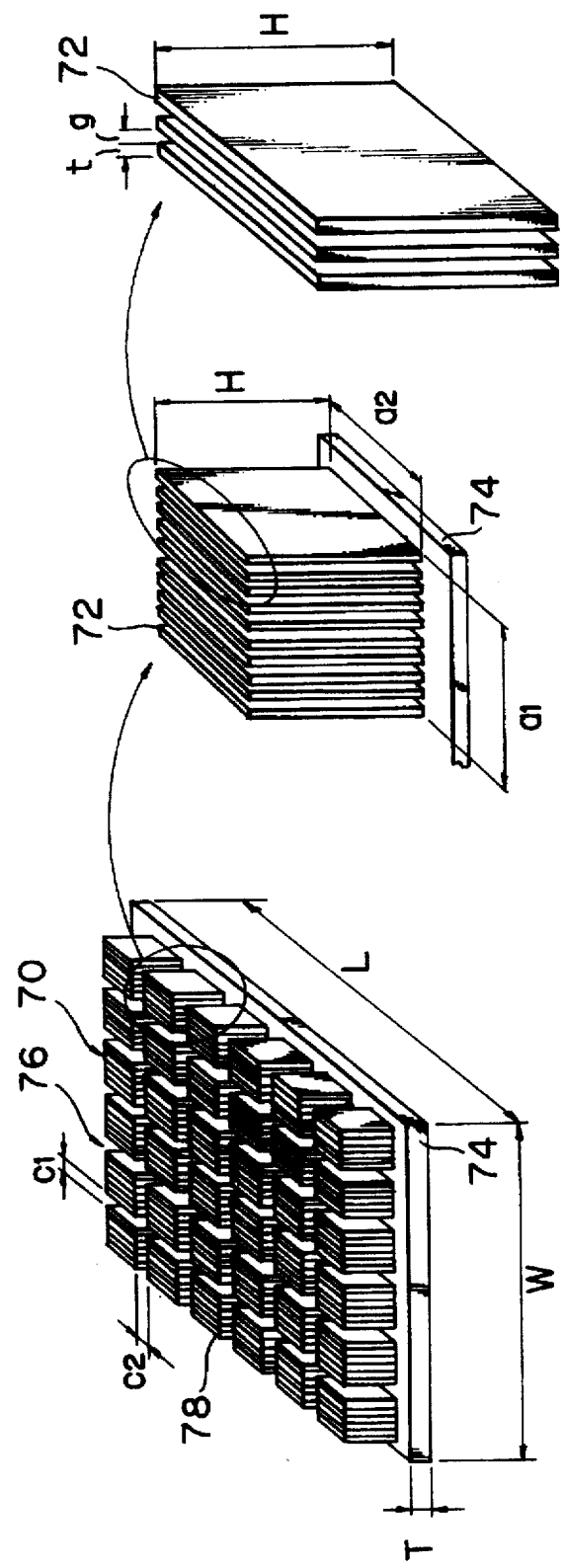

FIG. 7a is a perspective view of a heat sink composed of fin groups each comprising plate type heat dissipating fins according to the present invention, FIG. 7b is an enlarged view of one of the fin groups in the heat sink, and FIG. 7c is an enlarged view of three heat dissipating fins in the fin group shown in FIG. 7b.

As shown in FIG. 7a, the fin groups indicated by 70 are aligned in a matrix form and the heat dissipating plates in the form of plane parallel plates indicated by 72 are also aligned in a row. The spacings 76, 78 between fin groups 70 or the gap g between heat dissipating fins 72 can be set at appropriate values. The heat dissipating fins 72 are integral with the bottom plate 74. The symbols used in FIGS. 7a–c to indicate the dimensions of the heat sink are the same as those used in FIGS. 4a–b.

Figure 8:
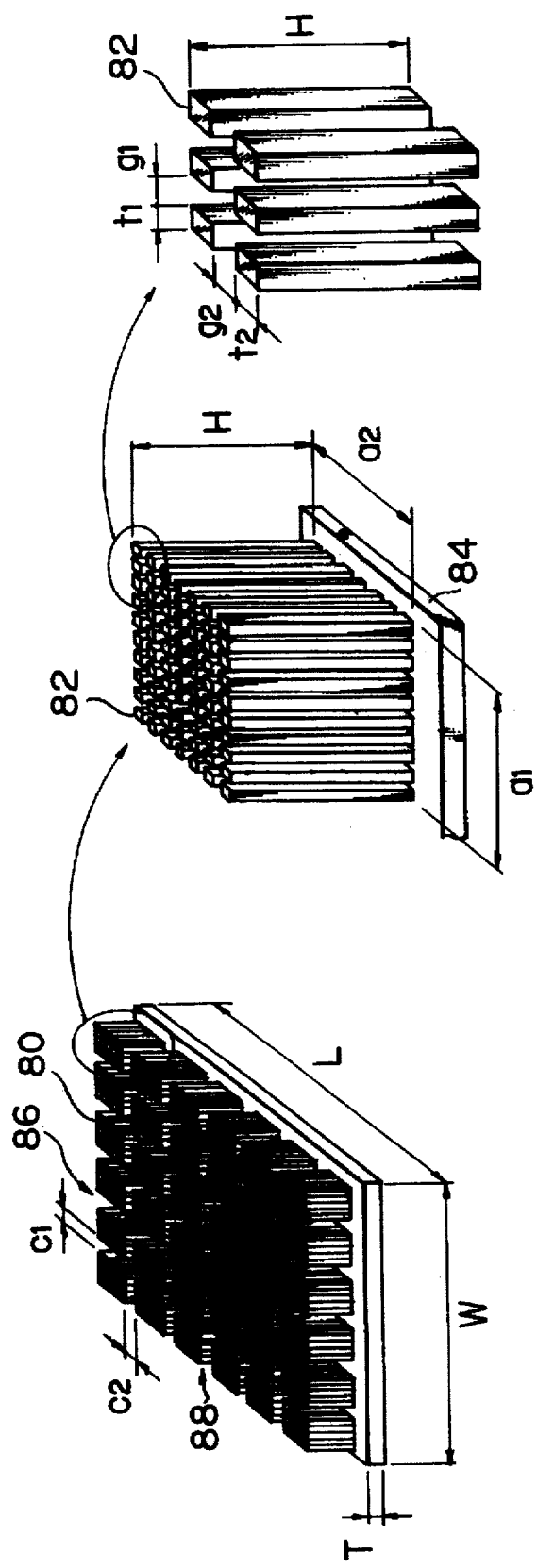

FIG. 8a is a perspective view of a heat sink composed of fin groups 80 each comprising pin type heat dissipating fins 82 according to the present invention. FIG. 8b is an enlarged view of one of the fin groups in the heat sink, and FIG. 8c is an enlarged view of six heat dissipating pins 82 in the fin group shown in FIG. 8b. In this case, too, the spacings 86, 88 between fin groups 80 or the gap $g_1$ between heat dissipating pins 82 can be set at appropriate values. The heat dissipating pins 82 are integral with the bottom plate 84. The symbols used in FIGS. 8a–c to indicate the dimensions of the heat sink are the same as those used in FIGS. 4a–b.

In one embodiment of the present invention, a hollow space may be provided in each group of heat dissipating plates or pins, as described below. To form groups of heat dissipating plates or pins, the same procedure as described above can be repeated except that the workpiece having solid projection members 52 shown in FIG. 4a is replaced by the workpiece having hollow projection members 53 shown in FIG. 4b.

Figure 11:
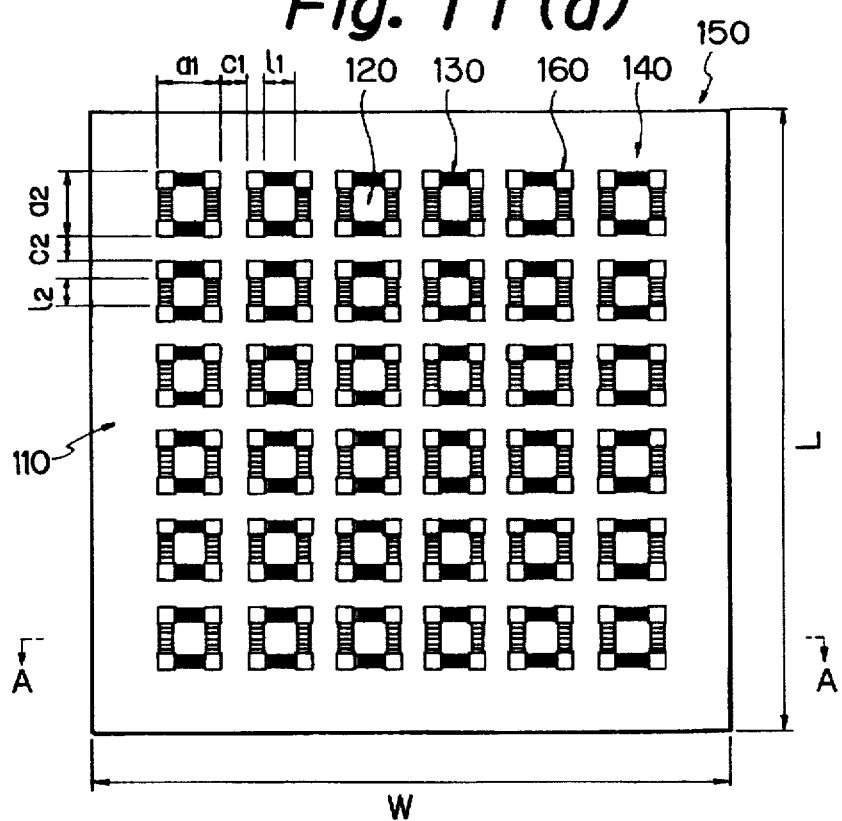
Figure 11:
Figure 11:
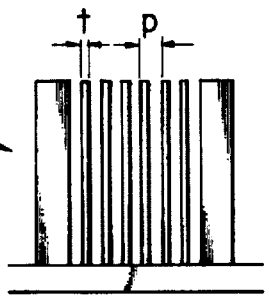
Figure 11:
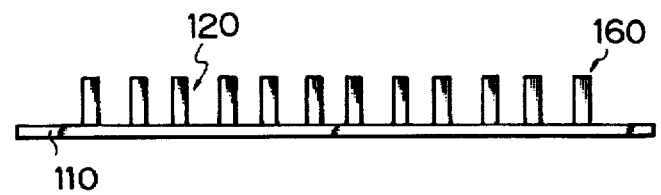

FIG. 11a is a plan view of an example of a heat sink with cooling fins thus produced in accordance with the present invention, FIG. 11b is a side view of the same heat sink, FIG. 11c is a cross section taken along Line A—A of FIG. 11a, and FIG. 11d is an enlarged view of the encircled portion B of FIG. 11b.

As shown, the heat sink generally indicated by 150 comprises a bottom plate 110 made of a good heat conductor, hollow projecting sections 160 that extend from the bottom plate 110 and each have a hollow space 120, and heat dissipating fin groups 140 that are made of a good heat conductor and extend from the bottom plate 110. Each fin group surrounds one of the hollow spaces 120 to form one of the hollow projecting sections 160. Each of the heat dissipating fin groups 140 is composed of a plurality of fin elements 130 (heat dissipating plates in the case shown).

A plurality (6×6=36 in this case) of heat dissipating fin groups 140 are aligned in a matrix pattern.

In this heat sink 150, the dimensions of the bottom plate (W×L×T), the height (H) of the fins, the dimensions of a cross section of a hollow place on the bottom plate ($l_1 \times l_2$), the dimensions of a fin group ($a_1 \times a_2$), the spacing between fin groups ($c_1$ or $c_2$), the thickness (t) of the heat dissipating plate, and the pitch (p) of the heat dissipating plates are adjustable to appropriate values.

Figure 12:
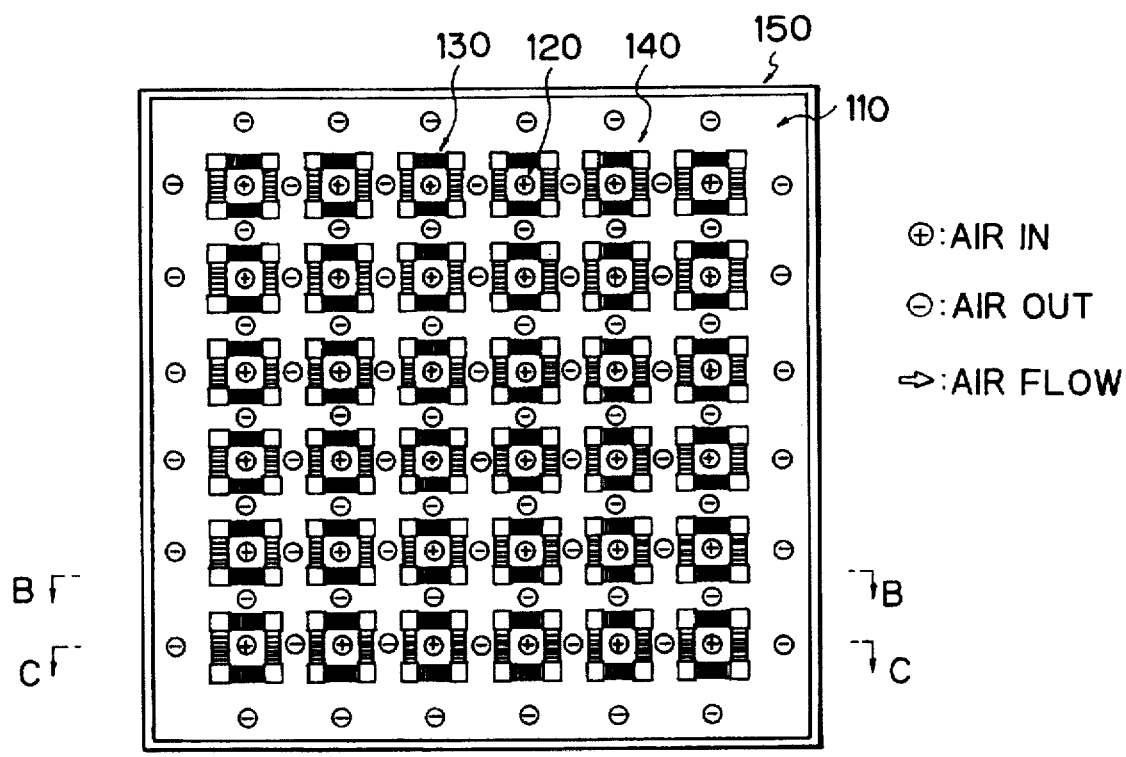
Figure 12:
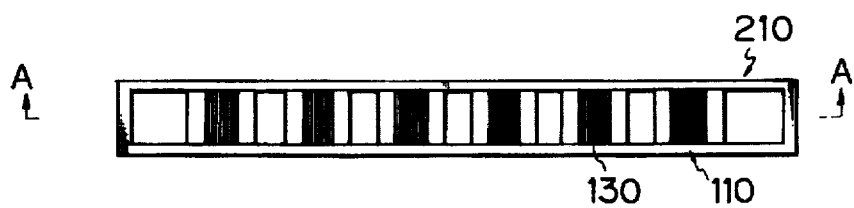
Figure 12:
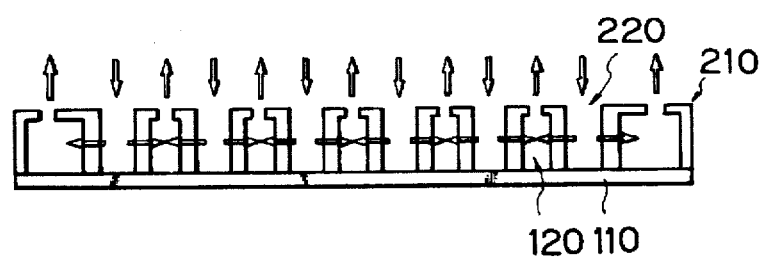

FIG. 12a–c illustrate an example of the method of cooling the heat sink shown in FIGS. 11a–d by forced air circulation. FIG. 12a is a cross section taken along Line A—A of FIG. 12b, FIG. 12b is a cross section taken along Line B—B of FIG. 12a, and FIG. 12c is a cross section along Line C—C of FIG. 12a.

In this embodiment, a top plate 210 is attached to the heat sink 150, openings are made in the top plate 210 in positions that correspond to the hollow spaces of the respective heat-dissipating fin groups 140, and the top plate 210 is placed in intimate contact with the top of each heat dissipating plate 130 so that the top plate 210, together with the bottom plate 110 and the heat dissipating fin groups 140, will form fluid channels of a rectangular cross section. The heat generated from heat generating elements in the form of chips passes through the bottom plate 110 of the heat sink to be transferred to the heat-dissipating fin groups 140 by conduction. On the other hand, cold cooling air is supplied into the hollow spaces 120 of the fin groups through the openings 220 in the top plate and thereafter flows through the fluid channels of a rectangular cross section which are defined by the bottom plate 110, the heat-dissipating fin groups 140 and the top plate 210, whereby heat is removed from the heat-dissipating fin groups 140. The air that has removed heat from the heat-dissipating fin groups 140 and which has become warm is recovered by being discharged from the non-projecting areas around the heat-dissipating fin groups 140, as shown by arrows in FIG. 12c.

If desired, the flow of cooling air may be reversed in such a way that it is supplied to the areas around the heat-dissipating fin groups 140 while the warmed air is recovered by being discharged through the openings 220 in the top plate.

The foregoing description concerns the case where the working fluid is supplied or discharged through the hollow spaces of the hollow projecting sections whereas it is discharged or supplied from the non-projecting areas around the fin groups. It should, however, be noted that equally good results can be obtained merely by supplying or discharging the working fluid through the hollow spaces of the hollow projecting members.

Figure 13:
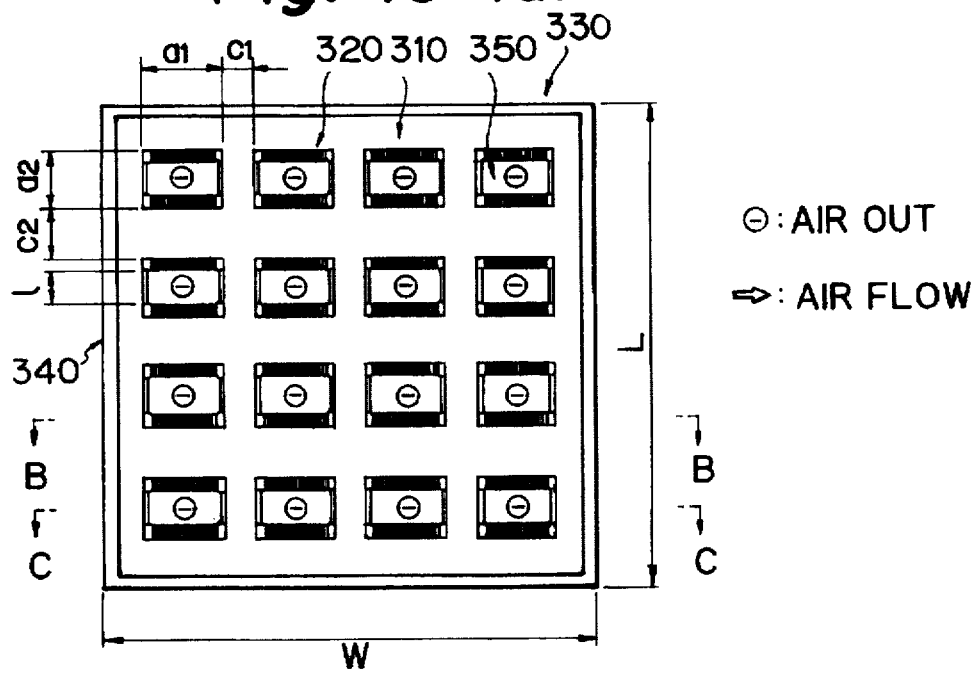
Figure 13:
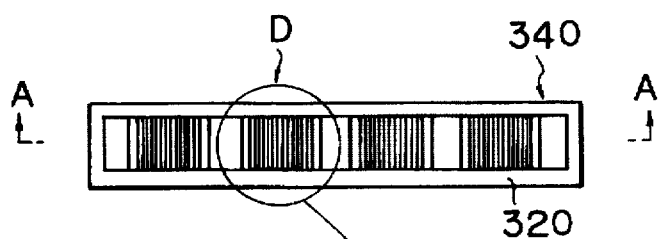
Figure 13:
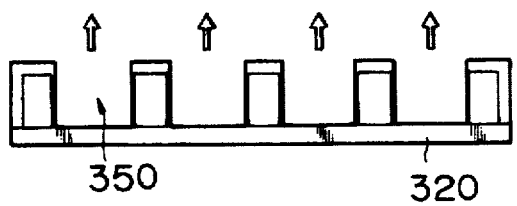
Figure 13:
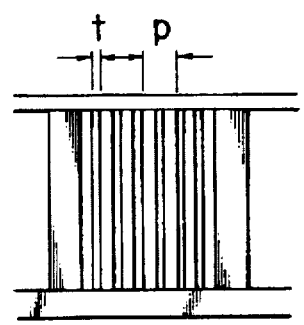

FIGS. 13a–d show an example of this modified case. FIG. 13a is a cross section taken along Line A—A of FIG. 13b, FIG. 13b is a cross section taken along Line B—B of FIG. 13a, FIG. 13c is a cross section taken along Line C—C of FIG. 13a, and FIG. 13d is an enlarged view of the encircled portion D of FIG. 13b.

The heat sink generally indicated by 330 is fitted with a resin top plate 340 which is a heat insulator of the type shown in FIGS. 12a–d. Heat-dissipating fin groups 310 provided on the bottom plate 320 are aligned in a matrix pattern, and air which is the working fluid is discharged through the openings made in the top of plate 340 in positions that correspond to the hollow spaces 350.

FIGS. 14a–d show another example of a heat sink 430 of the invention, in which cold air is supplied through hollow spaces 450 defined by a top plate 440 whereas warmed air is discharged from the non-projecting areas around heat-dissipating fin groups 410, which are integral with the bottom plate 420. FIG. 14a is a cross section taken along Line A—A of FIG. 14b, FIG. 14b is a cross section taken along Line B—B of FIG. 14a, FIG. 14c is a cross section taken along Line C—C of FIG. 14a, and FIG. 14d is an enlarged view of the encircled portion D of FIG. 14b.

Thus, according to the above-described embodiment of the present invention, the heat-dissipating fin groups assure uniform and efficient cooling by permitting the working fluid to be aspirated or supplied through the hollow spaces of the hollow projecting sections.

Needless to say, greater effects will be attained if the working fluid is in a liquid form.

As will be apparent from the foregoing description, the heat-dissipating fin groups on the heat sink that are provided with hollow spaces are in no way limited to those having the geometries specified above, and many modifications are possible without departing from the scope and spirit of the present invention.

A single fin group may be used when the fin group is comprised of a hollow projecting section.

In the present invention, all parts of the cooling air supplied will flow uniformly into those fluid channels in the heat sink and pass through them which are defined by the bottom plate, the heat-dissipating fin groups, and the top plate, if any. Hence, unlike cooling by the prior art method, the cooling air flow will not get around the heat sink, so the cooling process can be carried out efficiently with a reduced air flow. Consequently, the heat sink constructed in accordance with the present invention is not highly susceptible to the effects of fluid resistance that would otherwise develop (as in the prior art) if the pitch of the fins (the spacing between adjacent fins) were reduced in order to increase the heat dissipating area of the heat sink.

The foregoing description of the present invention concerns the case where the heat-dissipating fin groups are spaced on the bottom plate to form a matrix pattern but it goes without saying that they may be arranged in a staggered or a random pattern.

It should also be understood that the hollow projecting members may have varying sizes.

It is desirable that the wire saw running speed be around 450 m/min or less.

The following examples are provided for the purpose of further illustrating the present invention but are in no way to be taken as limiting.

EXAMPLE 1

A pure aluminum workpiece of the geometry shown in FIG. 4a was prepared by cold forging. The workpiece had the following dimensions: L=W=60 mm; $a_1$=11.42 mm; $a_2$=10.00 mm; $c_1$=3.28 mm; $c_2$=4.0 mm; T=1.0 mm; and H=14.0 mm.

The workpiece was secured to a work table 63 as shown in FIGS. 5a and 5b and urged against a wire array 61a consisting of piano wires (0.4 mm diameter) spaced with a pitch of 0.7 mm and stretched as shown in FIG. 5a. 16 wires were arranged in 4 rows in positions where they contacted the projections 52 on the workpiece and 5 wires were arranged in 3 rows in positions where they did not contact the projections 52 on the workpiece. The wire array was run at a speed of 400 m per minute. While a working fluid containing an abrasive powder (#600 GC) in a lapping oil was applied over the wire array through a nozzle 65, the work table 63 was elevated at a speed of 0.3 mm per minute so that the workpiece was urged against the wire array 61a to form grooves having a depth of 14 mm. As a result, a heat sink having the configuration shown in FIGS. 7a–c was produced. 16 fin groups were arranged in a 4×4 matrix on the bottom plate and each fin group consisted of 17 plane parallel plate heat-dissipating fins (t=0.22 mm; g=0.48 mm).

Figure 9:
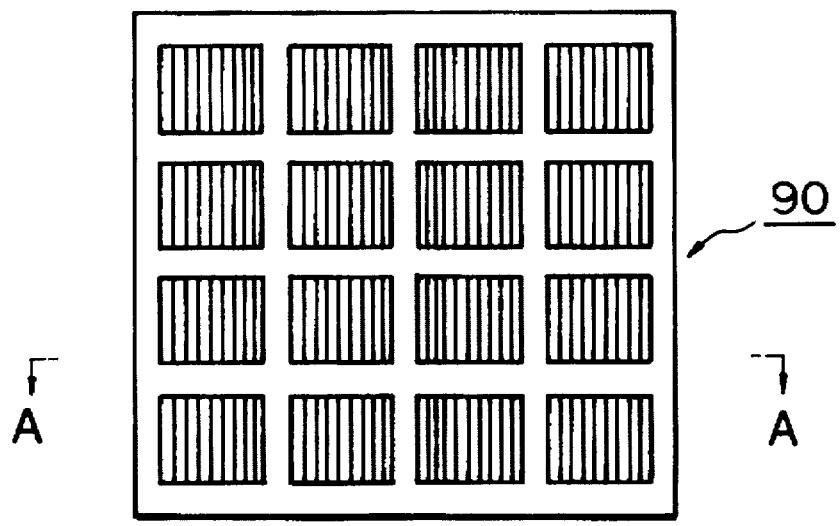
Figure 9:
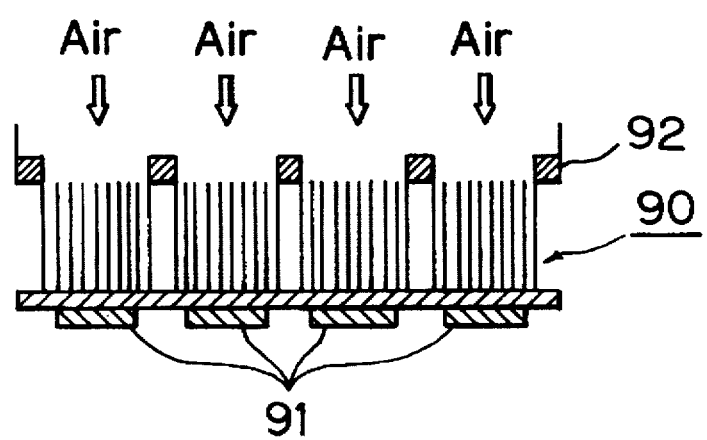

The thus produced heat sink 90 was mounted on a heater assembly 91 and a flow regulator assembly 92 as shown in FIGS. 9a and 9b to fabricate a structure that would permit cooling air to flow in the plane parallel plate fin groups in a direction perpendicular to the bottom plate surface. This setup was subjected to an experiment in a wind tunnel under varying heat generation and air flow conditions with the inlet temperature held at 20° C. With heat generated at a rate of 80 W and cooling air flowing at a rate of 2800 cc/sec (175 cc/sec supplied per fin group), the pressure loss was around 800 Pa and the heat resistance value was around 0.6 K/W, demonstrating the remarkable cooling performance of this heat sink.

In terms of the density of heat generation, the cooling capability of the heat sink being tested was equivalent to 2.2 W/cm$^2$. With air cooling on a conventional heat sink, the limit of cooling a single package was around 15 W in terms of the quantity of heat generation and around 1 W/cm$^2$ in terms of the density of heat generation. Considering that a pressure loss of around 350 Pa occurred in that instance, one may safely conclude that the heat sink of Example 1 has outstanding heat dissipating performance since the rate of heat dissipation increased by a factor of 5.3 whereas the pressure loss decreased by about one half per unit rate of heat dissipation.

EXAMPLE 2

A workpiece made of an aluminum alloy (A2024) having the geometry shown in FIG. 4a was prepared by cutting. The workpiece had the following dimensions: L=W=100 mm; $a_1$=$a_2$=11.42 mm; $C_1$=$C_2$=4.0 mm; T=1.0 mm; and H=20.0 mm.

The workpiece was secured to a work table 63 as shown in FIGS. 5a and 5b and urged against a wire array 61a consisting of piano wires (0.4 mm diameter) spaced with a pitch of 0.7 mm and stretched as shown in FIG. 5a. 16 wires were arranged in 6 rows in positions where they contacted the projections 52 on the workpiece and 7 wires were arranged in 5 rows in positions where they did not contact the projections 52 on the workpiece. The wire array was run at a speed of 400 m per minute. While a working fluid containing an abrasive powder (#600 GC) in a lapping oil was applied over the wire array, the work table 63 was elevated at a speed of 0.35 mm per minute so that the workpiece was urged against the wire array 61a to form grooves having a depth of 20 mm.

The resulting semifinished heat sink had the configuration shown in FIGS. 7a–c. 36 fin groups were aligned in a 6×6 matrix form on the bottom plate and each fin group consisted of 17 plane parallel plate heat-dissipating fins (t=0.22 mm; g=0.48 mm). Then, the work table 63 was lowered to detach the semifinished product from the wire array and the semi- finished product was rotated through 90° on the work table until the heat-dissipating plates crossed the wire array at right angles. The workpiece was urged against the same wire array as used in shaping the semifinished product and the wire array was run at a speed of 400 m per minute. While a working fluid containing an abrasive powder (#600 GC) in a lapping oil was applied over the wire array, the work table was elevated at a speed of 0.95 mm per minute so that the workpiece was urged against the wire array 61a to form grooves having a depth of 20 mm.

As a result, a complete heat sink having the configuration shown in FIGS. 8a–c was produced; 36 fin groups were aligned in a 6×6 matrix form on the bottom plate and each fin group consisted of 289 heat-dissipating pins in a 17×17 matrix ($t_1$=$t_2$=0.22 mm; $g_1$=$g_2$=0.48 mm).

Figure 10:
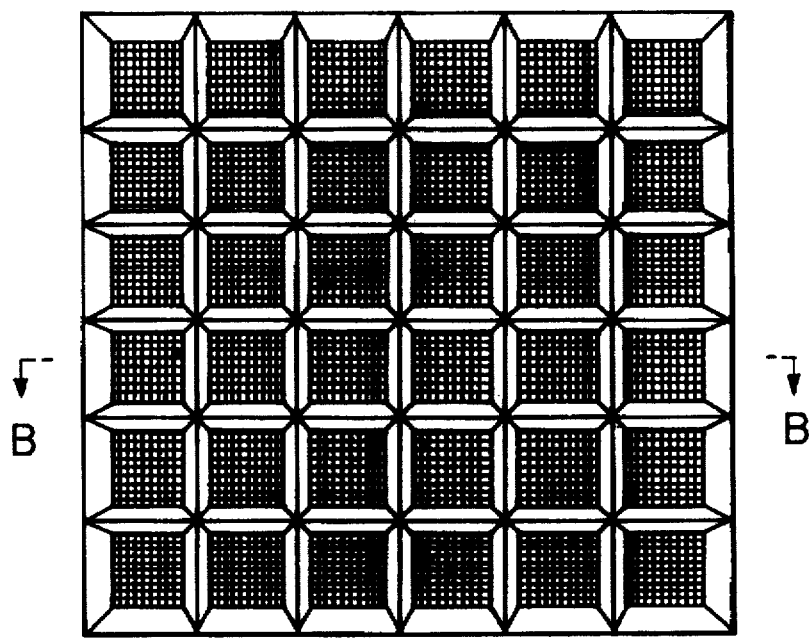
Figure 10:
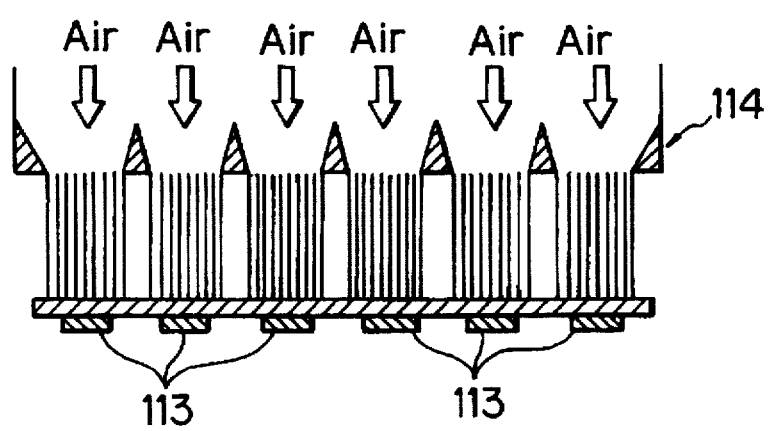

The resulting heat sink was mounted on a heater assembly 113 and a flow regulator assembly 114 as shown in FIGS. 10a and 10b to fabricate a structure that would permit cooling air to flow in the plane parallel plate fin groups in a direction perpendicular to the bottom plate surface. This setup was subjected to an experiment in a wind tunnel under varying heat generation and air flow conditions with the inlet temperature held at 20° C. With heat generated at a rate of 150 W and cooling air flowing at a rate of 4700 cc/sec (130 cc/sec supplied per fin group), the pressure loss was about 900 Pa and the heat resistance value was about 0.4 K/W, demonstrating the remarkable cooling performance of the heat sink tested.

In terms of the density of heat generation, the cooling capability of the heat sink being tested was equivalent to 1.5 W/cm$^2$. With air cooling of a conventional heat sink, the limit of cooling a single package was about 15 W in terms of the rate of heat generation and about 1 W/cm$^2$ in terms of the density of heat generation. Considering that a pressure loss of about 350 Pa occurred in that instance, one may safely conclude that the heat sink of Example 2 had an outstanding cooling performance since the amount of heat dissipation increased by a factor of 10 whereas the pressure loss decreased to about a quarter per unit rate of heat dissipation.

EXAMPLE 3

Workpieces of the same kind and geometry as used in Example 2 were subjected to grinding using the same wire array under the same conditions as in Example 2, except that the wire array was run at the seven different speeds of 600 m, 550 m, 500 m, 450 m, 400 m, 300 m, and 200 m per minute.

When the wire array was run at speeds of 600 m, 550 m, and 500 m per minute, part of the heat dissipating plates or pins cracked and satisfactory shaped articles were not produced. On the other hand, satisfactory shaped articles were produced when the wire array was run at speeds of 450 m, 400 m, 300 m, and 200 m per minute. These results suggest that satisfactory shaped articles could be produced even if the wire array were run at a speed lower than any of the values selected for the test, namely, at a speed slower than 200 m per minute.

EXAMPLE 4

An aluminum workpiece of the geometry shown in FIG. 4b was prepared. Using this workpiece, a heat sink indicated by 150 in FIGS. 11a–d was manufactured in the same manner as in Example 2. Thus, the heat sink was fabricated by arranging 36 pure aluminum heat-dissipating fin groups 140 on a bottom plate 110 in a 6×6 matrix. The heat sink had the following dimensions: L=W=100 mm; $a_1=a_2=10.0$ mm; $c_1=c_2=7.0$ mm; $l_1=l_2=5.05$ mm; T=2.0 mm; H=10.0 mm; p=0.4 mm; and t=0.15 mm. A resin top plate indicated by 210 in FIGS. 12a–c was attached as a heat insulator to the heat sink to construct a cooling assembly. A sheet of heater was attached to the rear side of the heat sink and the cooling performance of the heat sink was tested. As shown in FIGS. 12a–c, cooling air was supplied into the hollow spaces of the individual fin groups 140 and the warmed air was discharged from the non-projecting areas around the fin groups.

The test was conducted under varying heat generation and air flow conditions with the temperature at the inlet for cooling air being held at 25° C. With heat generated at a rate of 180 W and cooling air flowing at a rate of 6000 cc/sec (165 cc/sec supplied per fin group), the pressure loss was about 1080 Pa and the heat resistance value was about 0.3 K/W, demonstrating the remarkable cooling performance of the heat sink being tested.

In terms of the density of heat generation, the cooling capability of the heat sink under test was equivalent to 1.5 W/cm$^2$. With air cooling of a conventional heat sink, the limit of cooling a single package was about 15 W in terms of the rate of heat generation and about 1 W/cm$_2$ in terms of the density of heat generation. Considering that a pressure loss of about 350 Pa occurred in that instance, one may safely conclude that the heat sink of Example 4 had an outstanding cooling performance since the rate of heat dissipation increased by a factor of 12 whereas the pressure loss decreased to one third per unit rate of heat generation.

EXAMPLE 5

An aluminum workpiece of the geometry shown in FIG. 4b was prepared. Using this workpiece, a heat sink indicated by 330 in FIGS. 13a–d was manufactured in the same manner as in Example 1. Thus, the heat sink 330 was fabricated by arranging 16 Al alloy heat-dissipating fin groups 310 on a bottom plate 320 in a 4×4 matrix. The heat sink had the following dimensions: L=60 mm; W=70 mm; $a_1$=12.2 mm; $a_2$=9.5 mm; $c_1$=2.5 mm; $c_2$=4.0 mm; l=2.3 mm; T=2.0 mm; H=10.0 mm; p=0.5 mm; and t=0.2 mm. A resin top plate 340 was attached as a heat insulator to the heat sink to construct a cooling assembly. A sheet of heater was attached to the rear side of the heat sink and the cooling performance of the heat sink was tested. As shown in FIGS. 13a–d, cooling air was discharged through the hollow spaces 350 of the individual fin groups 310 so that it would flow into fluid channels between fins from around the fin groups.

The test was conducted under varying heat generation and air flow conditions with the temperature at the inlet for cooling air being held at 25° C. With heat generated at a rate of 100 W and cooling air flowing at a rate of 3200 cc/sec (200 cc/sec supplied per fin group), the pressure loss was about 900 Pa and the heat resistance value was about 0.4 K/W.

In terms of the density of heat generation, the cooling capability of the heat sink under test was equivalent to 2.4 W/cm$^2$. With air cooling on the conventional heat sink, the limit of cooling a single package was about 15 W at maximum in terms of the rate of heat generation and about 1 W/cm$^2$ in terms of the density of heat generation. Considering that a pressure loss of ca. 350 Pa occurred in that instance, one may safely conclude that the heat sink of Example 5 had an outstanding cooling performance since the rate of heat dissipation increased by a factor of 6.7 whereas the pressure loss decreased to about two fifths per unit rate of heat generation.

EXAMPLE 6

Figure 14:
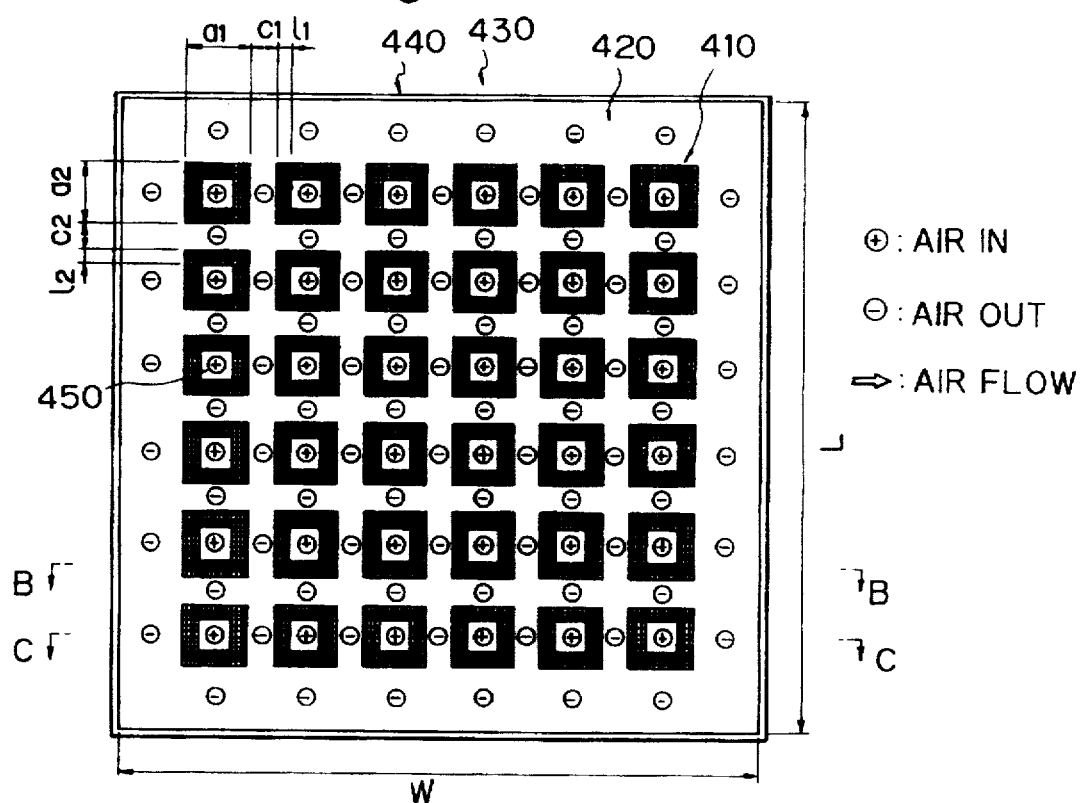
Figure 14:
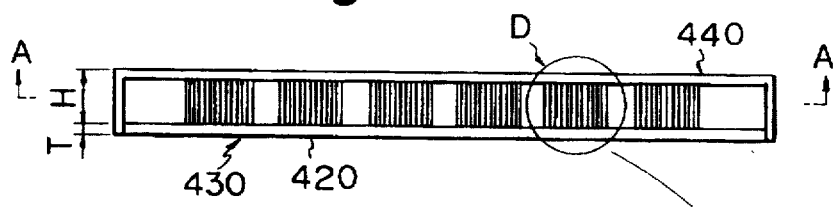
Figure 14:
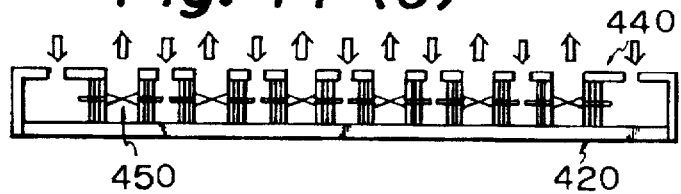
Figure 14:
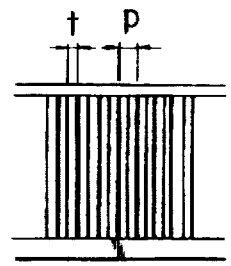

A copper workpiece of the geometry shown in FIG. 4b was prepared. Using this workpiece, a heat sink indicated by 430 in FIGS. 14a–d was manufactured in the same manner as in Example 2. Thus, the heat sink 430 was fabricated by arranging 36 copper pin type heat-dissipating fin groups 410 on a bottom plate 420 in a 6×6 matrix. The heat sink had the following dimensions: L=W=100 mm; $a_1=a_2$=12.3 mm; $c_1=c_2$=4.0 mm; $l_1=l_2$=3.1 mm; T=1.0 mm; H=5.0 mm; p=0.5 mm; and t=0.2 mm. A resin top plate 440 was attached as a heat insulator to the heat sink to construct a cooling assembly. A sheet of heater was attached to the rear side of the heat sink and the cooling performance of the heat sink was tested. As shown in FIG. 14, cooling air was supplied through the hollow spaces 450 of the individual fin groups 410 whereas the warmed air was discharged from around the fin groups.

The test was conducted under varying heat generating and air flow conditions with the temperature at the inlet for cooling air being held at 25° C. With heat generated at a rate of 250 W and cooling air flowing at a rate of 6000 cc/sec (165 cc/sec supplied per fin group), the pressure loss was around 2200 Pa and the heat resistance value was around 0.25 K/W.

In terms of the density of heat generation, the cooling capability of the heat sink being tested was equivalent to 2.5 W/cm$^2$. With air cooling of a conventional heat sink, the limit of cooling a single package was about 15 W in terms of the rate of heat generation and about 1 W/cm$^2$ in terms of the density of heat generation. Considering that a pressure loss of about 350 Pa occurred in that instance, one may safely conclude that the heat sink of Example 6 had an outstanding cooling performance since the rate of heat dissipation increased by a factor of 17 whereas the pressure loss decreased to about two fifths per unit rate of heat generation.

The heat sink cooling fin of the present invention has a much larger area of heat dissipation than conventional heat sinks of the same volume factor. Furthermore, all parts of the cooling (working) fluid being supplied are allowed to pass through the heat dissipating areas in a comparatively small flow quantity. Hence, compared to the conventional cooling method, the present invention insures a marked improvement in cooling capability while suppressing a possible increase in pressure loss due to the flow resistance developing in the fluid channels. As a result, multi-chip modules which are characterized by extremely large quantity and density of heat generation can be cooled to a permissible temperature by forced air circulation with a conventional small-size blower.

It should also be noted that the heat sink cooling fin of the present invention is applicable to the cooling of not only multi-chip modules but also single-chip modules as well.

What is claimed is:

1. A heat sink comprising a bottom plate and a plurality of fin groups on said bottom plate that are spaced from one another and aligned in a matrix or arranged in a staggered pattern, each of the fin groups being separated from an adjacent fin group by at least a first distance, each of said fin groups comprising a plurality of plane parallel plates or pins in the form of projecting sections or hollow projecting sections that are integral with said bottom plate, each of the plates or pins being separated from an adjacent plate or pin by at most a second distance, the first distance being greater than the second distance.

2. A heat sink according to claim 1, wherein the fin groups are spaced apart by grooves having a width of at least 2–3 mm.

3. A heat sink according to claim 1, wherein the heat sink further comprises a top plate which is placed in contact with the top of at least one of the plane parallel plates or pins to form fluid channels together with the bottom plate and the fin groups.

4. A heat sink according to claim 1 wherein the fin groups are aligned in a matrix.

5. A heat sink according to claim 1 wherein the fin groups are arranged in a staggered pattern.

6. A heat sink according to claim 1 wherein each of the cooling fins is in the shape of a plane parallel plate.

7. A heat sink according to claim 1 wherein each of the cooling fins is in the shape of a pin.

8. A heat sink according to claim 1 wherein each of the fin groups comprises a plurality of cooling fins in the form of hollow projecting sections.

9. A heat sink according to claim 1 wherein each of the cooling fins is in the shape of a plane parallel plate.

10. A heat sink according to claim 1 wherein each of the cooling fins is in the shape of a pin.

11. A heat sink according to claim 1, wherein each of the fin groups includes a central hollow space surrounded by the fins.

12. A heat sink according to claim 1, wherein each of the fin groups includes a plurality of plane parallel plate fins and a plurality of pins.

13. A heat sink according to claim 1, wherein the bottom plate is of a metal selected from the group consisting of aluminum, copper, an aluminum alloy and a copper alloy.

14. A heat sink according to claim 1, wherein a plurality of cooling channels separate adjacent fin groups by a distance which exceeds a gap separating adjacent fins in the fin groups.

15. A heat sink according to claim 14, wherein the distance is at least 2 mm.

16. A heat sink according to claim 1, further comprising a top plate having spaced-apart openings therethrough, the openings being in fluid communication with gaps between fins of the fin groups, the top plate being spaced from the bottom plate and forming a plurality of fluid cooling channels between the fin groups.

17. A heat sink according to claim 1, further comprising a top plate which encloses fluid channels between adjacent fin groups, the top plate having spaced-apart openings therethrough overlying the fin groups.

18. A heat sink according to claim 1, further comprising an integrated circuit arrangement bonded to the bottom plate.

19. A heat sink according to claim 1, wherein the cooling fins and the bottom plate are of a unitary piece of metal selected from the group consisting of steel, aluminum, copper and alloys thereof.

20. A heat sink according to claim 1, wherein the cooling fins comprise wire sawed plates and/or pins.

21. A heat sink according to claim 1, wherein the fins have a thickness of about 0.22 mm, adjacent fins of each fin group are spaced apart by a distance of about 0.48, and adjacent fin groups are spaced apart by a distance of at least 2 mm.

22. A heat sink according to claim 1, wherein the cooling fins and bottom plate are integrally formed from a single piece of metal.

23. A heat sink according to claim 1, wherein the cooling fins are formed by recesses in a single piece of material.

* * * * *